United States Patent
Minemura et al.

(10) Patent No.: US 11,563,025 B2
(45) Date of Patent: Jan. 24, 2023

(54) SEMICONDUCTOR STORAGE DEVICE

(71) Applicant: KIOXIA CORPORATION, Tokyo (JP)

(72) Inventors: Yoichi Minemura, Yokkaichi Mie (JP); Kensei Takahashi, Kuwana Mie (JP); Takashi Asano, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 210 days.

(21) Appl. No.: 17/004,777

(22) Filed: Aug. 27, 2020

(65) Prior Publication Data
US 2021/0296352 A1 Sep. 23, 2021

(30) Foreign Application Priority Data
Mar. 19, 2020 (JP) .............................. JP2020-049901

(51) Int. Cl.
| | |
|---|---|
| *H01L 27/11582* | (2017.01) |
| *H01L 27/11524* | (2017.01) |
| *H01L 27/11556* | (2017.01) |
| *H01L 27/1157* | (2017.01) |
| *H01L 21/02* | (2006.01) |

(Continued)

(52) U.S. Cl.
CPC .. *H01L 27/11582* (2013.01); *H01L 21/02164* (2013.01); *H01L 21/02178* (2013.01);
(Continued)

(58) Field of Classification Search
CPC ......... H01L 27/11582; H01L 21/02164; H01L 21/02178; H01L 21/76877; H01L 23/5226;
(Continued)

(56) References Cited

U.S. PATENT DOCUMENTS

| | | | |
|---|---|---|---|
| 9,177,966 B1 * | 11/2015 | Rabkin | ............ H01L 27/11556 |
| 2017/0092651 A1 | 3/2017 | Kim et al. | |
| 2019/0148401 A1 * | 5/2019 | Lei | ................. H01L 27/11524 |
| | | | 257/314 |

FOREIGN PATENT DOCUMENTS

| | | |
|---|---|---|
| CN | 106935592 A | 7/2017 |
| CN | 110808254 A | 2/2020 |

OTHER PUBLICATIONS

E. H. SNOW et al., "Polarization Phenomena and Other Properties of Phosphosilicate Glass Films on Silicon", Mar. 1966, Journal of The Electrochemical Society, vol. 113, No. 3, pp. 263-269.

(Continued)

*Primary Examiner* — Patricia D Valenzuela
(74) *Attorney, Agent, or Firm* — Kim & Stewart LLP

(57) ABSTRACT

A semiconductor storage device includes first and second stacked bodies, a first semiconductor layer, a first charge storage layer, a conductive layer, and a first silicon oxide layer. The first stacked body includes first insulation layers and first gate electrode layers that are alternately stacked in a first direction. The first semiconductor layer extends in the first stacked body in the first direction. The first charge storage layer is provided between the first semiconductor layer and the first gate electrode layers. The conductive layer is provided between the first stacked body and the second stacked body and extends in the first direction and a second direction. The first silicon oxide layer is provided between the conductive layer and the first gate electrode layers. The first silicon oxide layer containing an impurity being at least one of phosphorus, boron, carbon, and fluorine.

20 Claims, 16 Drawing Sheets

(51) Int. Cl.
*H01L 23/522* (2006.01)
*H01L 21/768* (2006.01)
*H01L 23/532* (2006.01)
H01L 29/66 (2006.01)
H01L 29/423 (2006.01)

(52) U.S. Cl.
CPC .... *H01L 21/76877* (2013.01); *H01L 23/5226* (2013.01); *H01L 23/5329* (2013.01); *H01L 27/1157* (2013.01); *H01L 27/11524* (2013.01); *H01L 27/11556* (2013.01); *H01L 29/42344* (2013.01); *H01L 29/66833* (2013.01)

(58) Field of Classification Search
CPC ........... H01L 23/5329; H01L 27/11524; H01L 27/11556; H01L 27/1157; H01L 27/11565; H01L 29/40117; H01L 29/66833; H01L 29/42344
See application file for complete search history.

(56) References Cited

OTHER PUBLICATIONS

J. M. Eldridge et al., "Sodium Ion Drift through Phosphosilicate Glass-SiO$_2$ Films", Jun. 1971, Journal of The Electrochemical Society, vol. 118, No. 6, pp. 986-991.
P. Balk et al., "Phosphosilicate Glass Stabilization of FET Devices", Sep. 1969, Proceedings of the IEEE, vol. 57, No. 9, pp. 1558-1563.

* cited by examiner

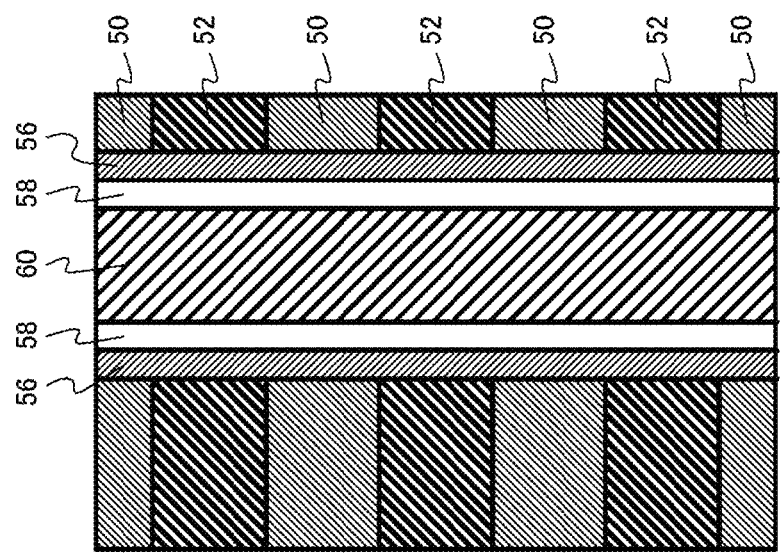
FIG. 7
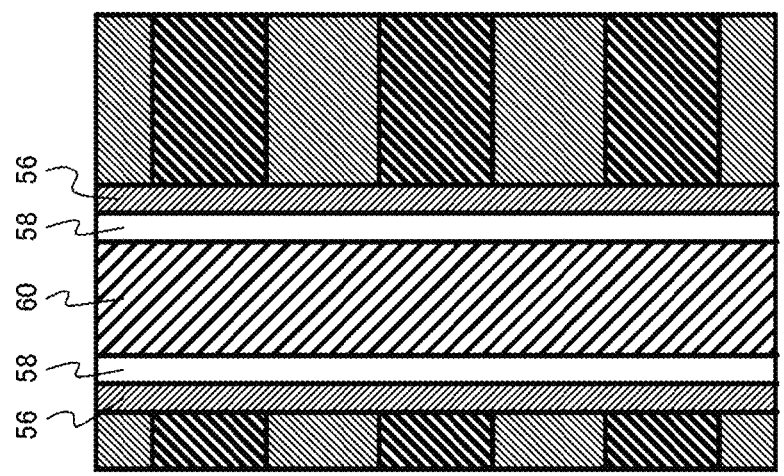
FIRST DIRECTION

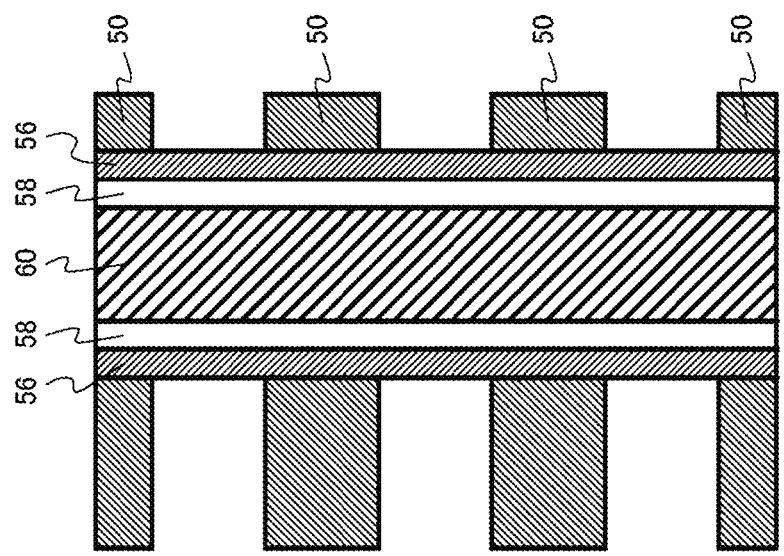
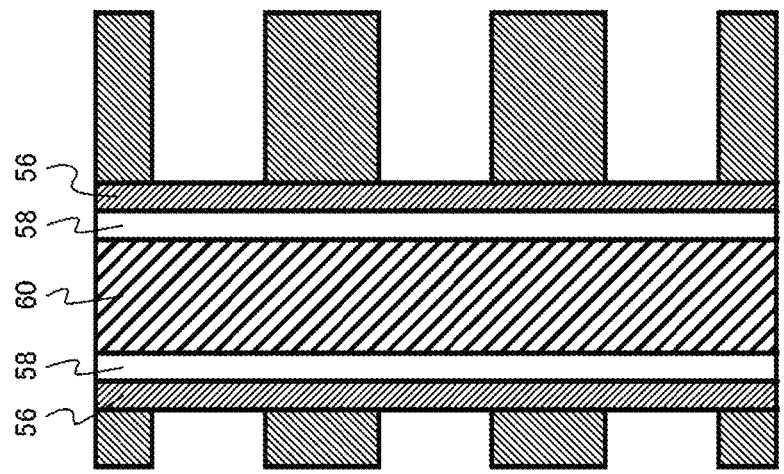
FIG. 8

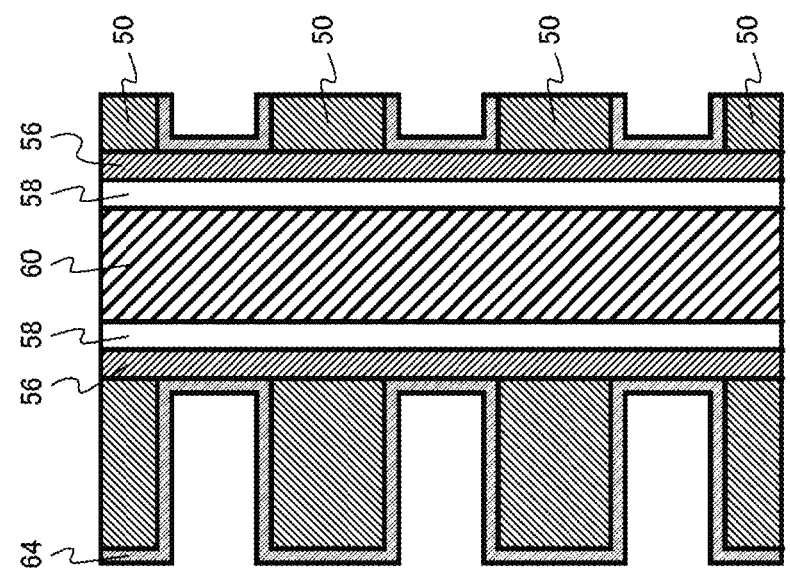
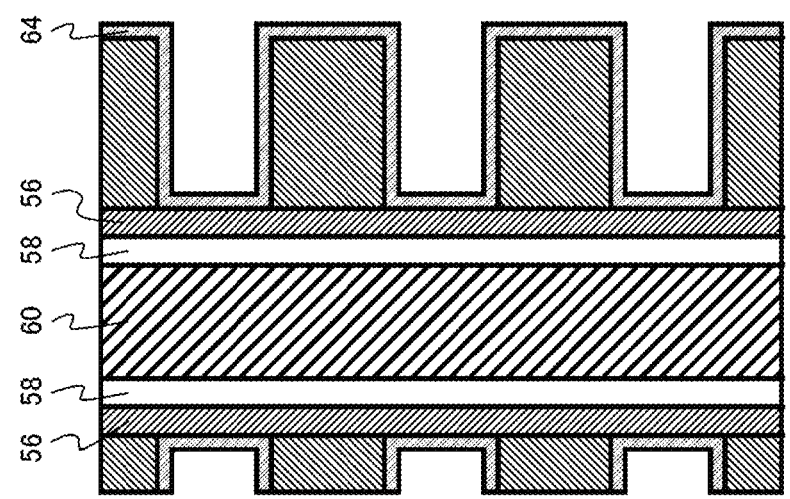
FIG. 9

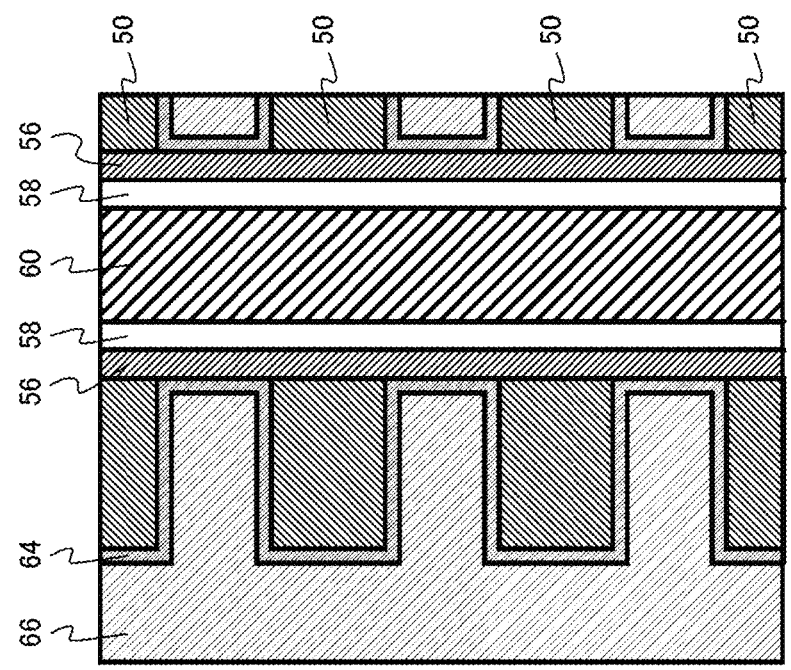
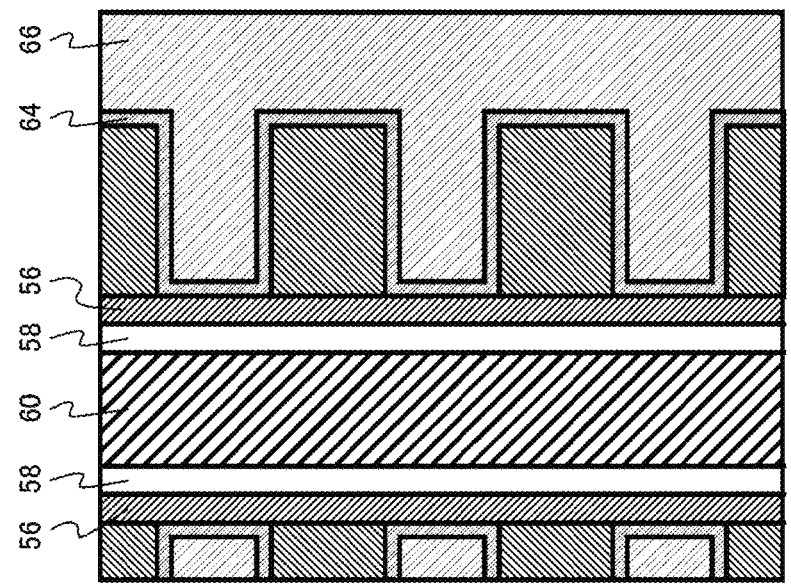
FIG. 10

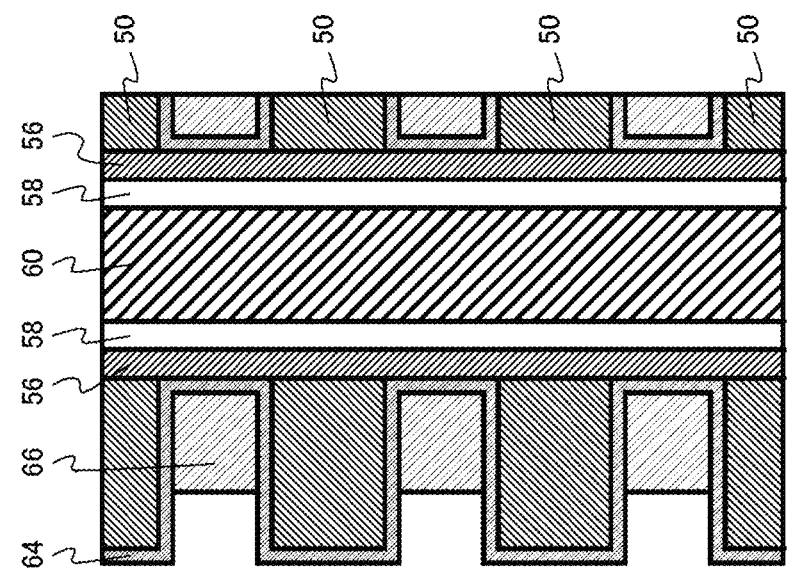
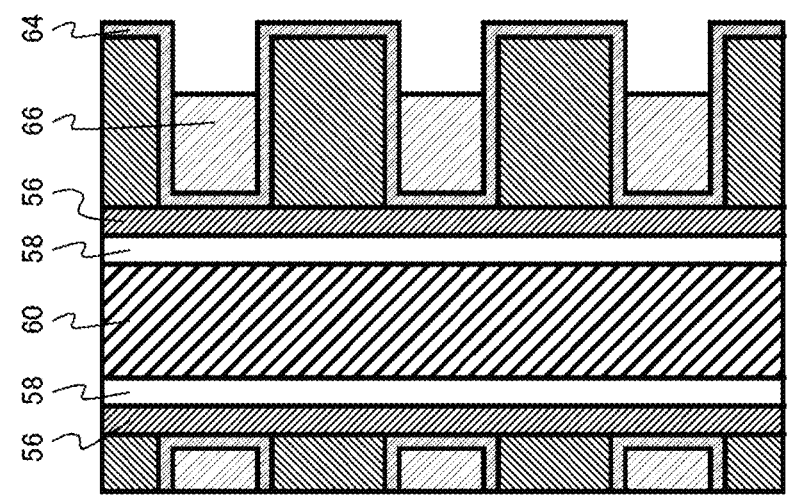
FIG. 11

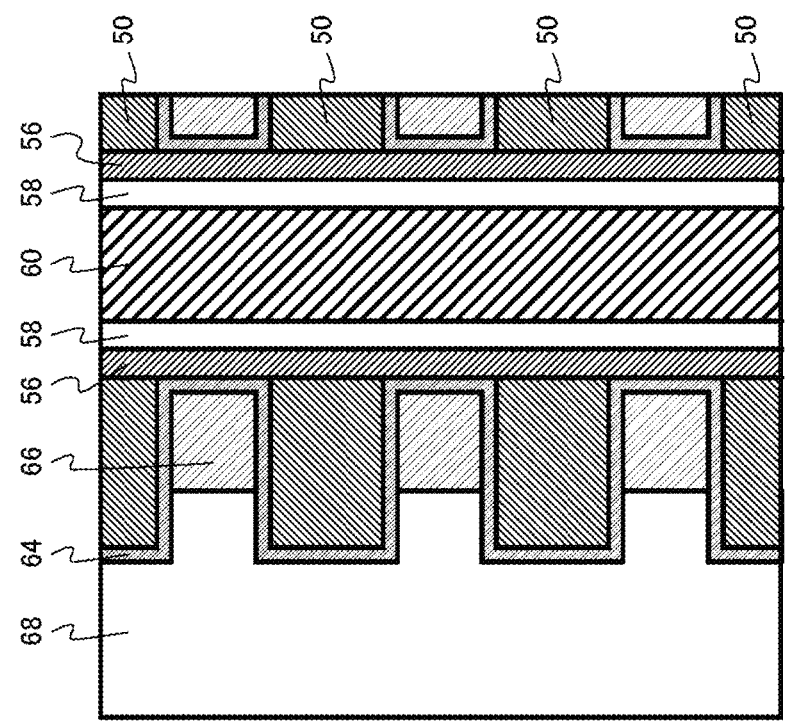
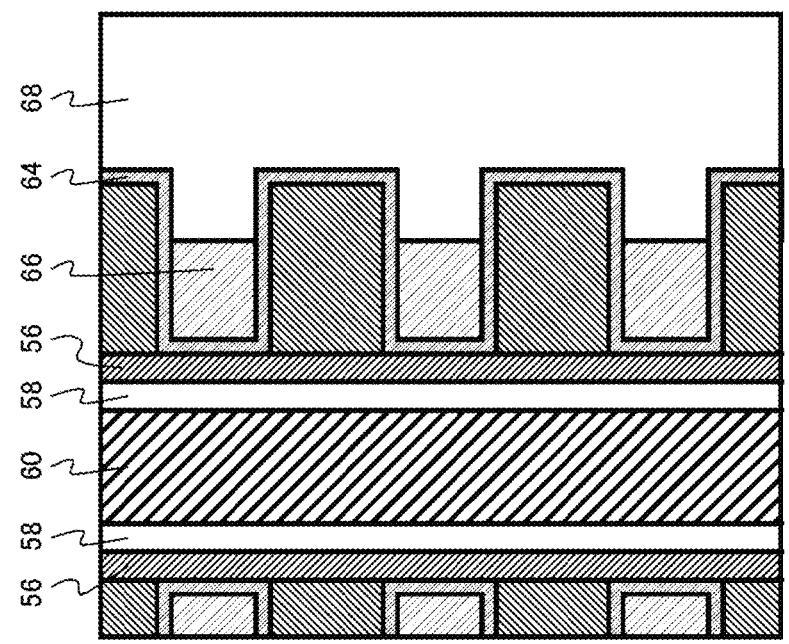
FIG. 12

SEMICONDUCTOR STORAGE DEVICE

CROSS-REFERENCE TO RELATED APPLICATION(S)

This application is based upon and claims the benefit of priority from Japanese Patent Application No. 2020-049901, filed on Mar. 19, 2020, the entire contents of which are incorporated herein by reference.

FIELD

Embodiments described herein relate generally to a semiconductor storage device.

BACKGROUND

A three-dimensional NAND flash memory in which memory cells are stacked three-dimensionally achieves a high degree of integration and has low costs. In the three-dimensional NAND flash memory, a memory hole passing through a stacked body is formed. The stacked body is formed by alternately stacking an insulation layers and an electrode layers. A charge storage layer and a semiconductor layer are formed in the memory hole, thereby forming a memory string in which a plurality of memory cells are connected in series. Data is stored in the memory cells by controlling an amount of charges retained in the charge storage layer.

BRIEF DESCRIPTION OF THE DRAWINGS

FIGS. 4-13 are schematic cross-sectional diagrams to explain a method for manufacturing a semiconductor storage device according to a first embodiment.

DETAILED DESCRIPTION

Figure 1:
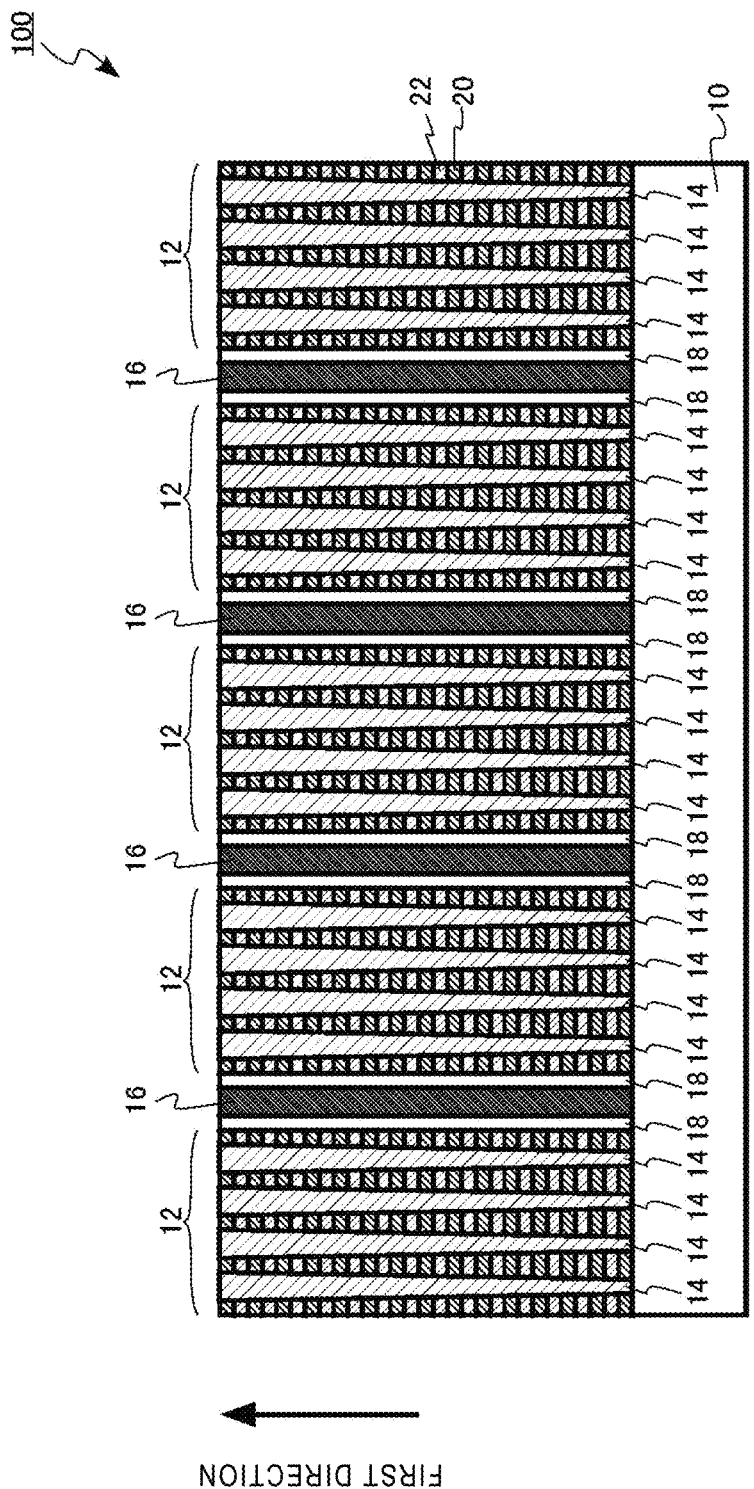
FIG. 1 illustrates a schematic cross-sectional view of a memory cell array of a semiconductor storage device according to a first embodiment.

In general, according to an embodiment, a semiconductor storage device includes first and second stacked bodies, first and second semiconductor layers, first and second charge storage layers, a conductive layer, and a first silicon oxide layer. The first stacked body includes a plurality of first insulation layers and a plurality of first gate electrode layers that are alternately stacked in a first direction. The first semiconductor layer extends in the first stacked body in the first direction. The first charge storage layer is provided between the first semiconductor layer and the plurality of first gate electrode layers. The second stacked body includes a plurality of second insulation layers and a plurality of second gate electrode layers that are alternately stacked in the first direction. The second semiconductor layer extends in the second stacked body in the first direction. The second charge storage layer is provided between the second semiconductor layer and the plurality of second gate electrode layers. The conductive layer is provided between the first stacked body and the second stacked body and extending in the first direction and a second direction perpendicular to the first direction. The first silicon oxide layer is provided between the conductive layer and the plurality of first gate electrode layers. The first silicon oxide layer containing an impurity including at least one of phosphorus (P), boron (B), carbon (C), and fluorine (F).

Hereinafter, certain example embodiments will be described with reference to drawings. In the following description, the same or substantially similar components or aspects are denoted by the same reference numerals, and description of the components or aspect already described may be omitted.

In the present specification, terms "up" or "down" or the like may be used for convenience of description. However, in this context such terms as "up" or "down" are terms indicating, a relative positional relationship between components or aspects in the drawings or the like. The terms "up" and "down" do not necessarily reflect any orientation or a positional relationship with respect to gravity.

Qualitative and quantitative analyses for analyzing chemical composition of components or aspects constituting a semiconductor storage device in the present specification may be performed using secondary ion mass spectrometry (SIMS), energy dispersive X-ray spectroscopy (EDX), and the like. A transmission electron microscope (TEM) or the like may be used to measure a thickness of a component or aspect of the semiconductor storage device, a distance between components or aspects, and the like.

First Embodiment

A semiconductor storage device according to a first embodiment includes a first stacked body formed by alternately stacking first insulation layers and first gate electrode layers in a first direction. A first semiconductor layer is provided in the first stacked body and extends in the first direction. A first charge storage layer is provided between the first semiconductor layer and first gate electrode layers. A second stacked body is formed by alternately stacking second insulation layers and second gate electrode layers in the first direction. A second semiconductor layer is provided in the second stacked body and extends in the first direction. A second charge storage layer is provided between the second semiconductor layer and the second gate electrode layers. A conductive layer is provided between the first stacked body and the second stacked body and extends in the first direction and a second direction perpendicular to the first direction. A first silicon oxide layer is provided between the first gate electrode layers and the conductive layer and contains at least one element selected from a group of elements including phosphorus (P), boron (B), carbon (C), and fluorine (F).

The semiconductor storage device according to the first embodiment is a three-dimensional NAND flash memory. A memory cell of the semiconductor storage device according to the first embodiment is a so-called Metal-Oxide-Nitride-Oxide-Semiconductor (MONOS) memory cell.

FIG. 1 illustrates a schematic cross-sectional view of a memory cell array of the semiconductor storage device according to the first embodiment. A wire layer on an upper part of a memory cell array 100 is omitted from the depiction in FIG. 1.

The memory cell array 100 includes a silicon substrate 10, a plurality of stacked bodies 12, a plurality of memory strings 14, conductive layers 16, and silicon oxide layers 18. The silicon substrate 10 is an example of a semiconductor substrate.

The stacked body 12 is formed by alternately stacking interlayer insulation layers 20 and gate electrode layers 22 in a first direction. The first direction is a normal to a surface of the silicon substrate 10.

The plurality of memory strings 14 pass through the stacked body 12. The memory strings 14 are provided in memory holes passing through the stacked body 12. The memory strings 14 extend in the stacked body 12 in the first direction. One memory string 14 and the plurality of gate electrode layers 22 form a plurality of memory cells.

The conductive layer 16 is provided between two stacked bodies 12. The conductive layer 16 passes through the stacked bodies 12. The conductive layer 16 extends in the stacked bodies 12 in the first direction. The conductive layer 16 is in contact with the silicon substrate 10. The conductive layer 16 has a function of applying a voltage to a lower end of the memory string 14 via the silicon substrate 10.

The silicon oxide layer 18 is provided between the conductive layer 16 and the stacked body 12. The silicon oxide layer 18 has a function of electrically separating the conductive layer 16 and the gate electrode layer 22.

Figure 2:
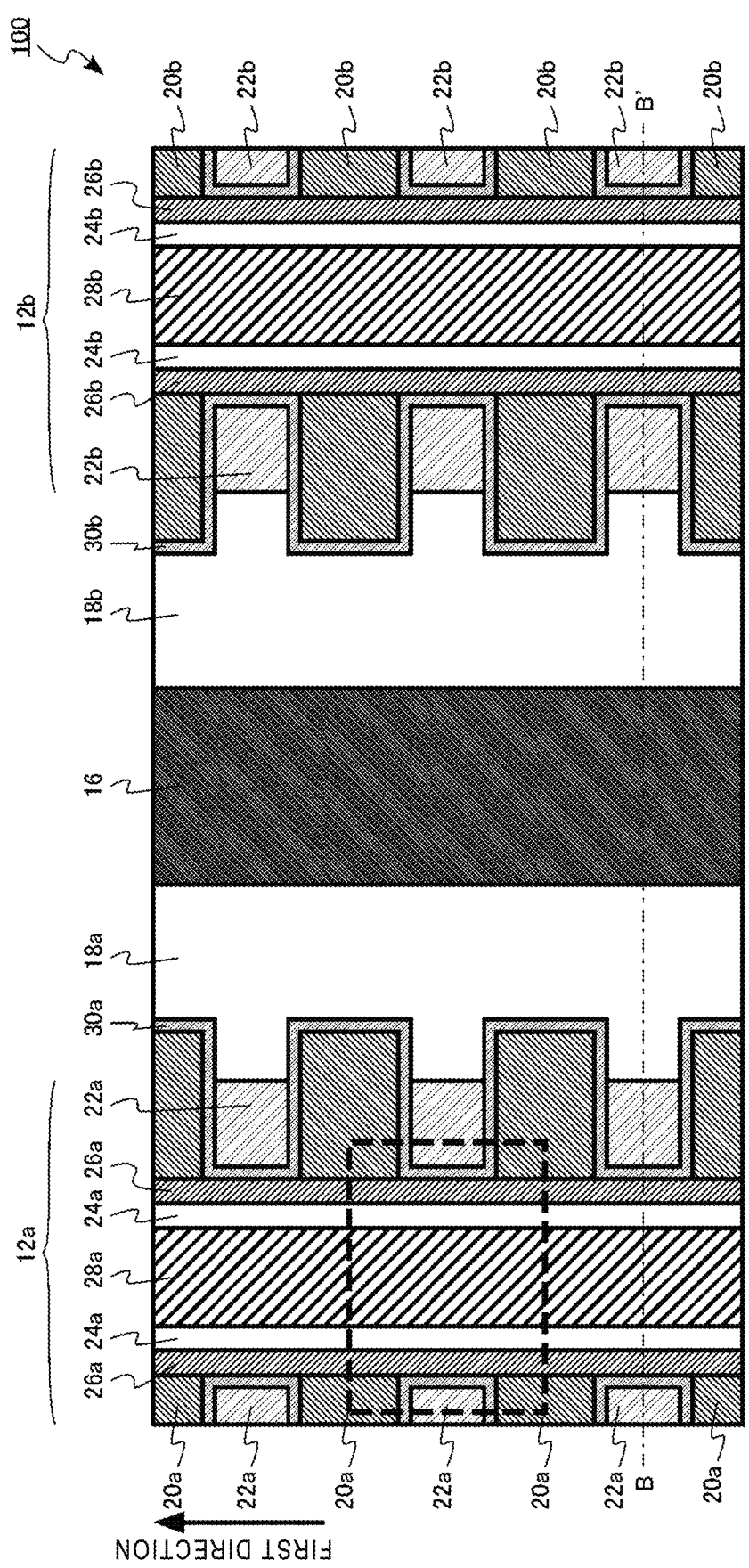
FIG. 2 illustrates an enlarged schematic cross-sectional view of a part of a memory cell array of a semiconductor storage device according to a first embodiment.
Figure 3:
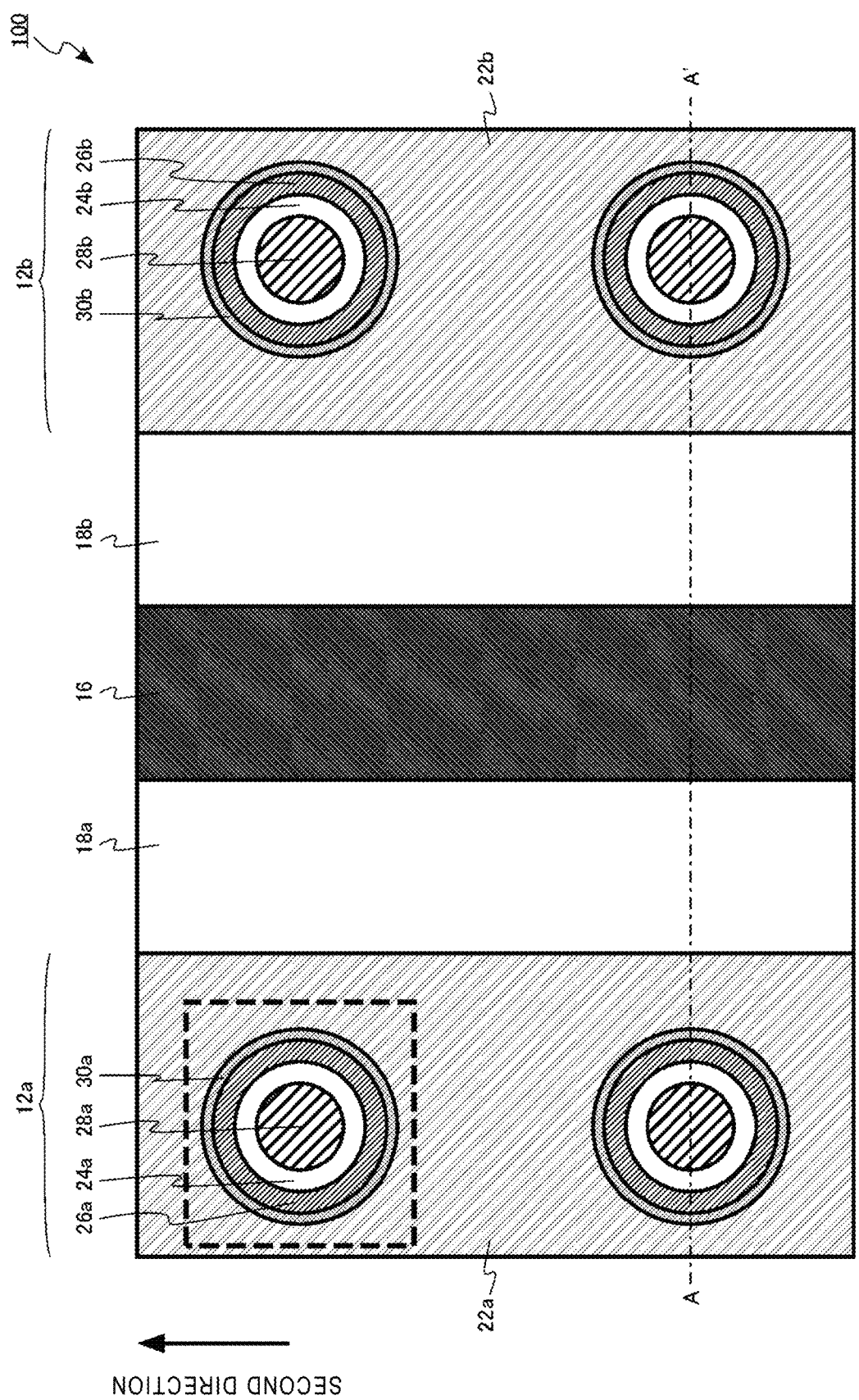
FIG. 3 illustrates an enlarged schematic cross-sectional view of a part of a memory cell array of a semiconductor storage device according to a first embodiment.

FIGS. 2 and 3 illustrate enlarged schematic cross-sectional views of parts of the memory cell array of the semiconductor storage device according to the first embodiment. FIG. 2 illustrates a cross-sectional view taken along AA' in FIG. 3. FIG. 3 illustrates a cross-sectional view taken along BB' in FIG. 2. A region surrounded by a dotted line corresponds to one memory cell in FIGS. 2 and 3.

The memory cell array 100 includes a first stacked body 12a, a second stacked body 12b, the conductive layer 16, a first silicon oxide layer 18a, a second silicon oxide layer 18b, a plurality of first interlayer insulation layers 20a, a plurality of second interlayer insulation layers 20b, a plurality of first gate electrode layers 22a, a plurality of second gate electrode layers 22b, a first semiconductor layer 24a, a second semiconductor layer 24b, a first charge storage layer 26a, a second charge storage layer 26b, a first core insulation layer 28a, a second core insulation layer 28b, a first aluminum oxide layer 30a, and a second aluminum oxide layer 30b.

The first interlayer insulation layer 20a is an example of a first insulation layer. The second interlayer insulation layer 20b is an example of a second insulation layer. The first aluminum oxide layer 30a is an example of an aluminum oxide layer.

The first stacked body 12a is formed by alternately stacking first interlayer insulation layers 20a and first gate electrode layers 22a in the first direction.

The first gate electrode layer 22a is, for example, a metal layer. The first gate electrode layer 22a includes, for example, tungsten (W). The first gate electrode layer 22a may have, for example, a structure in which a plurality of metal layers are stacked. The first gate electrode layer 22a has, for example, a structure in which a layer of titanium nitride (TiN) and a layer of tungsten (W) are stacked. A thickness of the first gate electrode layer 22a in the first direction is, for example, 5 nm to 20 nm.

The first interlayer insulation layer 20a electrically separates two otherwise adjacent first gate electrode layers 22a.

The first interlayer insulation layer 20a is, for example, silicon oxide. A thickness of the first interlayer insulation layer 20a in the first direction is, for example, 5 nm to 20 nm.

The first semiconductor layer 24a, the first charge storage layer 26a, and the first core insulation layer 28a form one memory string 14 in the first stacked body 12a.

The first semiconductor layer 24a extends in the first stacked body 12a in the first direction. The first semiconductor layer 24a passes through the first stacked body 12a. The first stacked body 12a is surrounded by a plurality of first gate electrode layers 22a. The first semiconductor layer 24a has, for example, a cylindrical shape. The first semiconductor layer 24a functions as a channel of a transistor of a memory cell.

The first semiconductor layer 24a is, for example, a polycrystalline semiconductor. The first semiconductor layer 24a is, for example, polycrystalline silicon.

The first charge storage layer 26a is provided between the first semiconductor layer 24a and the first gate electrode layer 22a. The first charge storage layer 26a includes a tunnel insulation film, a charge trapping film, a block insulation film, and the like from a first semiconductor layer 24a side. The charge trapping film is provided between the tunnel insulation film and the block insulation film. The tunnel insulation film, the charge trapping film, and the block insulation film are, for example, a silicon oxide film, a silicon nitride film, and a silicon oxide film, respectively.

The tunnel insulation film has a function of selectively causing charges to pass through. The charge trapping film has a function of trapping and storing charges. The block insulation film has a function of blocking a current flowing between the charge trapping film and the first gate electrode layer 22a. The memory cell is a so-called MONOS memory cell.

The first charge storage layer 26a is provided along a side surface of the first semiconductor layer 24a. The first charge storage layer 26a may be divided between adjacent memory cells in the first direction.

A threshold voltage of a transistor of a memory cell changes according to an amount of charges stored in the first charge storage layer 26a. Data can be stored in one memory cell by using a change in the threshold voltage.

For example, a voltage at which the transistor is turned on can be changed by changing the threshold voltage of the transistor of the memory cell. For example, when a state in which the threshold voltage is high is defined as data "0" and a state in which the threshold voltage is low is defined as data "1", the memory cell can store one bit data of "0" and "1" (binary data).

The first core insulation layer 28a is surrounded by the first semiconductor layer 24a. The first core insulation layer 28a extends in the first direction. The first core insulation layer 28a is, for example, a silicon oxide layer.

The second stacked body 12b is formed by alternately stacking a plurality of second interlayer insulation layers 20b and a plurality of second gate electrode layers 22b in the first direction.

The second semiconductor layer 24b, the second charge storage layer 26b, and the second core insulation layer 28b form one memory string 14 in the second stacked body 12b.

The second semiconductor layer 24b extends in the second stacked body 12b in the first direction. The second semiconductor layer 24b passes through the second stacked body 12b.

The second charge storage layer 26b is provided between the second semiconductor layer 24b and the second gate electrode layer 22b.

The second core insulation layer 28b is surrounded by the second semiconductor layer 24b. The second core insulation layer 28b extends in the first direction.

The second interlayer insulation layer 20b, the second gate electrode layer 22b, the second semiconductor layer 24b, the second charge storage layer 26b, and the second core insulation layer 28b have configurations and functions respectively the same as those of the first interlayer insulation layer 20a, the first gate electrode layer 22a, the first semiconductor layer 24a, the first charge storage layer 26a, and the first core insulation layer 28a.

The conductive layer 16 is provided between the first stacked body 12a and the second stacked body 12b. The conductive layer 16 extends in the first direction and the second direction perpendicular to the first direction. The conductive layer 16 has, for example, a plate shape. The conductive layer 16 is in contact with the silicon substrate 10.

The conductive layer 16 is, for example, a metal layer or a semiconductor layer. The conductive layer 16 contains, for example, tungsten (W). The conductive layer 16 may have, for example, a structure in which a plurality of metal layers are stacked. The conductive layer 16 has, for example, a structure in which a layer of titanium nitride (TiN) and a layer of tungsten (W) are stacked.

The first silicon oxide layer 18a is provided between the first stacked body 12a and the conductive layer 16. The first silicon oxide layer 18a is provided between the first gate electrode layer 22a and the conductive layer 16. The first silicon oxide layer 18a is in contact with the first gate electrode layer 22a. The first silicon oxide layer 18a is in contact with the conductive layer 16. The first silicon oxide layer 18a is provided between the first interlayer insulation layer 20a and the conductive layer 16.

The first silicon oxide layer 18a has a function of electrically separating the first gate electrode layer 22a and the conductive layer 16.

The first silicon oxide layer 18a contains silicon oxide as a main component. The main component of silicon oxide refers to that silicon oxide has a highest mole fraction among components contained in the first silicon oxide layer 18a.

The first silicon oxide layer 18a contains, as an impurity, at least one element selected from a group including phosphorus (P), boron (B), carbon (C), and fluorine (F). The first silicon oxide layer 18a is a silicon oxide layer containing, in an example, phosphorus (P). The first silicon oxide layer 18a is a silicon oxide layer containing, in another example, boron (B). The first silicon oxide layer 18a is a silicon oxide layer containing, in another example, carbon (C). The first silicon oxide layer 18a is a silicon oxide layer containing, in another example, fluorine (F).

A concentration of the impurity contained in the first silicon oxide layer 18a is, for example, $1\times10^{17}$ atoms/cm$^3$ to $1\times10^{21}$ atoms/cm$^3$.

The concentration of the impurity contained in the first silicon oxide layer 18a is, for example, higher than a concentration of the impurity in the first interlayer insulation layer 20a.

The first aluminum oxide layer 30a is provided between the first gate electrode layer 22a and the first charge storage layer 26a and between the first silicon oxide layer 18a and the first interlayer insulation layer 20a. The first aluminum oxide layer 30a functions as a part of a block insulation film of a memory cell. The first aluminum oxide layer 30a has a function of blocking a current flowing between the first charge storage layer 26a and the first gate electrode layer 22a.

The second silicon oxide layer 18b is provided between the second stacked body 12b and the conductive layer 16. The second silicon oxide layer 18b is provided between the second gate electrode layer 22b and the conductive layer 16. The second silicon oxide layer 18b is in contact with the second gate electrode layer 22b. The second silicon oxide layer 18b is in contact with the conductive layer 16. The second silicon oxide layer 18b is provided between the second interlayer insulation layer 20b and the conductive layer 16.

The second silicon oxide layer 18b has a function of electrically separating the second gate electrode layer 22b and the conductive layer 16.

The second silicon oxide layer 18b contains silicon oxide as a main component. The main component of silicon oxide refers to that silicon oxide has a highest mole fraction among components contained in the second silicon oxide layer 18b.

The second silicon oxide layer 18b contains, as an impurity, at least one element selected from a group including phosphorus (P), boron (B), carbon (C), and fluorine (F). The second silicon oxide layer 18b is a silicon oxide layer containing, in an example, phosphorus (P). The second silicon oxide layer 18b is a silicon oxide layer containing, in another example, boron (B). The second silicon oxide layer 18b is a silicon oxide layer containing, in another example, carbon (C). The second silicon oxide layer 18b is a silicon oxide layer containing, in another example, fluorine (F).

A concentration of the impurity contained in the second silicon oxide layer 18b is, for example, $1\times10^{17}$ atoms/cm$^3$ to $1\times10^{21}$ atoms/cm$^3$.

The concentration of the impurity contained in the second silicon oxide layer 18b is, for example, higher than a concentration of the impurity in the second interlayer insulation layer 20b.

The second aluminum oxide layer 30b is provided between the second gate electrode layer 22b and the second charge storage layer 26b and between the second silicon oxide layer 18b and the second interlayer insulation layer 20b. The second aluminum oxide layer 30b functions as a part of a block insulation film of a memory cell. The second aluminum oxide layer 30b has a function of blocking a current flowing between the second charge storage layer 26b and the second gate electrode layer 22b.

Next, an example of a method for manufacturing the semiconductor storage device according to the first embodiment will be described. Hereinafter, an example of a method for manufacturing the memory cell array 100 of the semiconductor storage device according to the first embodiment will be described.

FIGS. 4 to 13 are schematic cross-sectional diagrams to explain the method for manufacturing the semiconductor storage device according to the first embodiment. FIGS. 4 to 13 show cross-sectional structures corresponding to that shown in FIG. 2.

Figure 4:
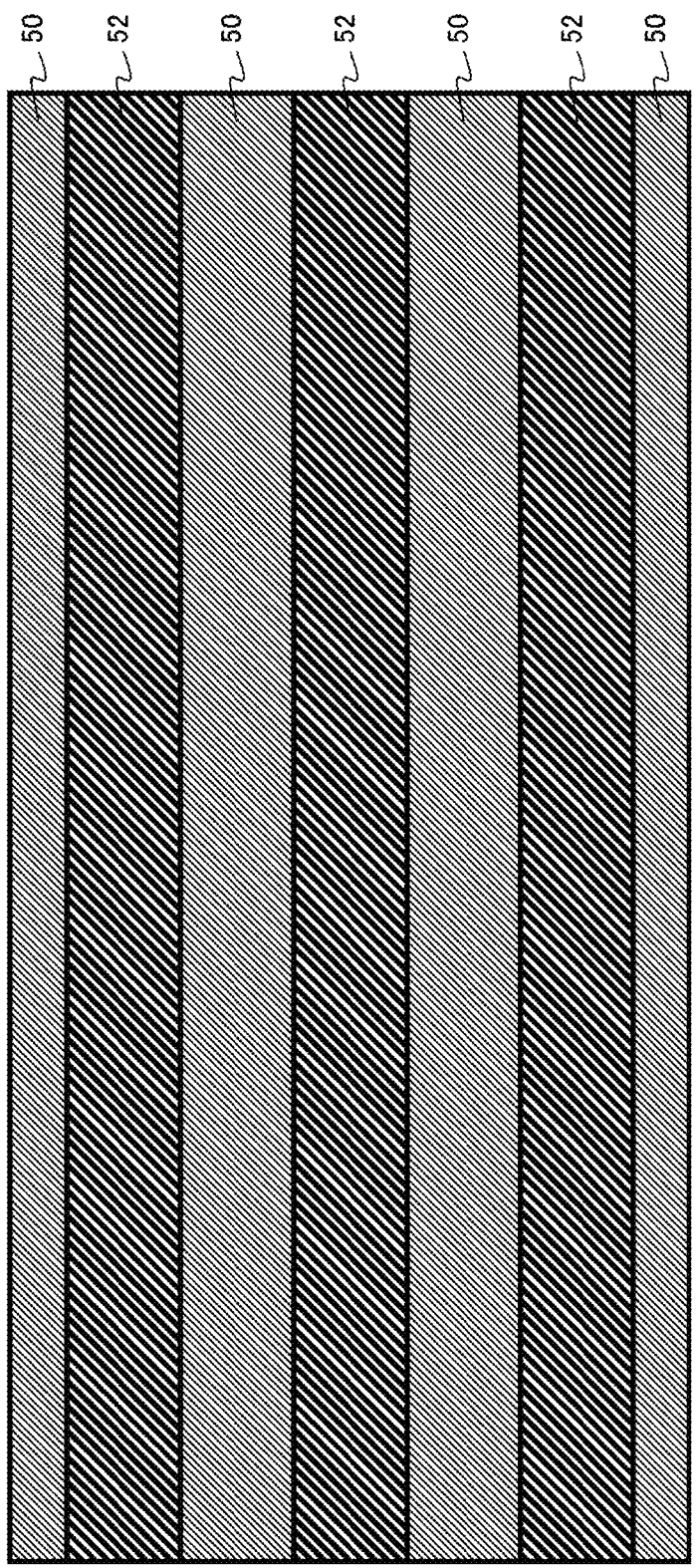

First, silicon oxide films 50 and silicon nitride films 52 are alternately stacked on a semiconductor substrate (not shown) (FIG. 4). A structure is formed in which a plurality of silicon oxide films 50 and a plurality of silicon nitride films 52 were alternately stacked in the first direction.

The silicon oxide film 50 and the silicon nitride film 52 are formed by a chemical vapor deposition (CVD) method or the like. A part of the silicon oxide films 50 is finally manufactured into the first interlayer insulation layer 20a and the second interlayer insulation layer 20b.

Figure 5:
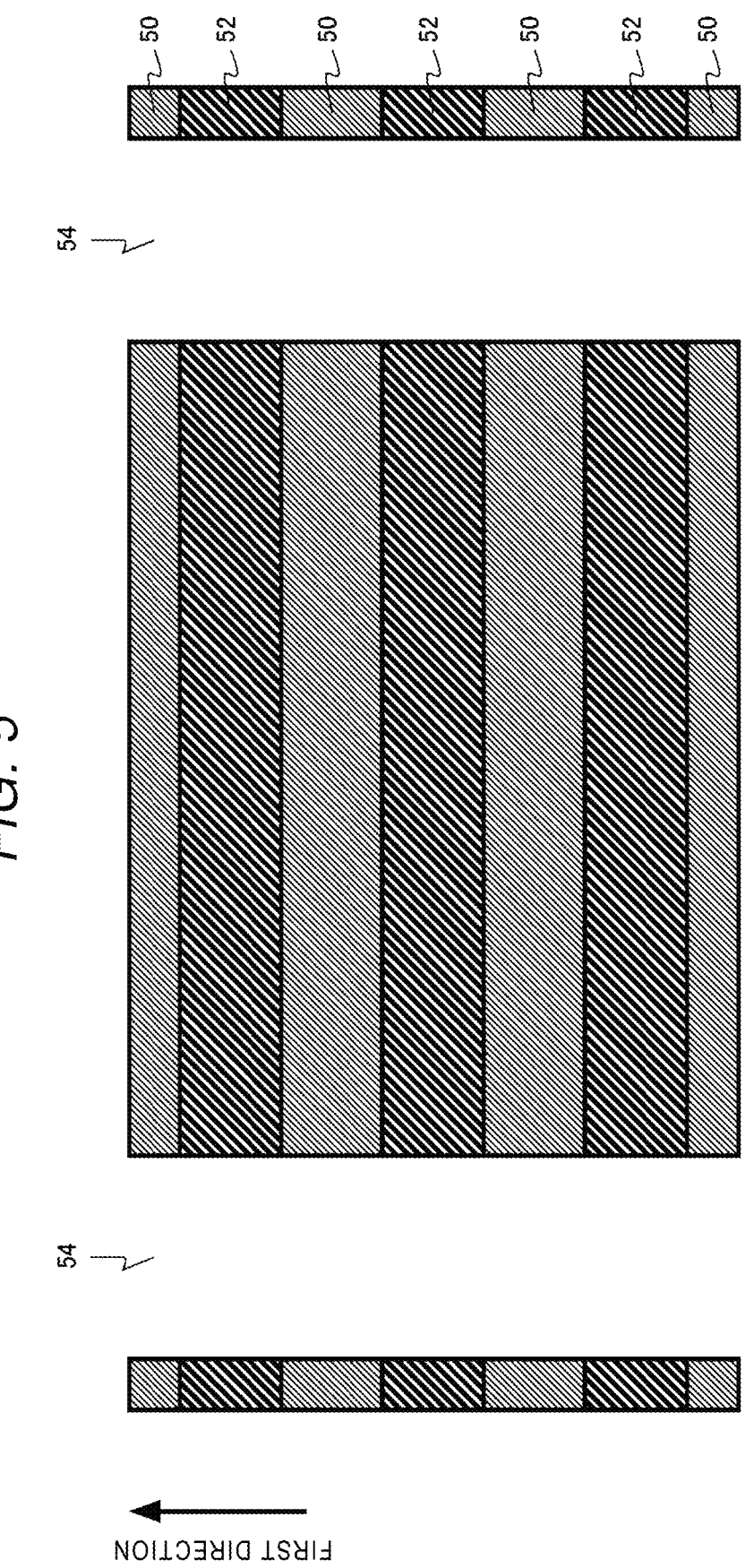

Next, a memory hole 54 is formed in the silicon oxide films 50 and the silicon nitride films 52 (FIG. 5). The memory hole 54 passes through the silicon oxide films 50 and the silicon nitride films 52 and extends in the first direction. The memory hole 54 is formed by a lithography method, a reactive ion etching (RIE) method, and the like.

Figure 6:
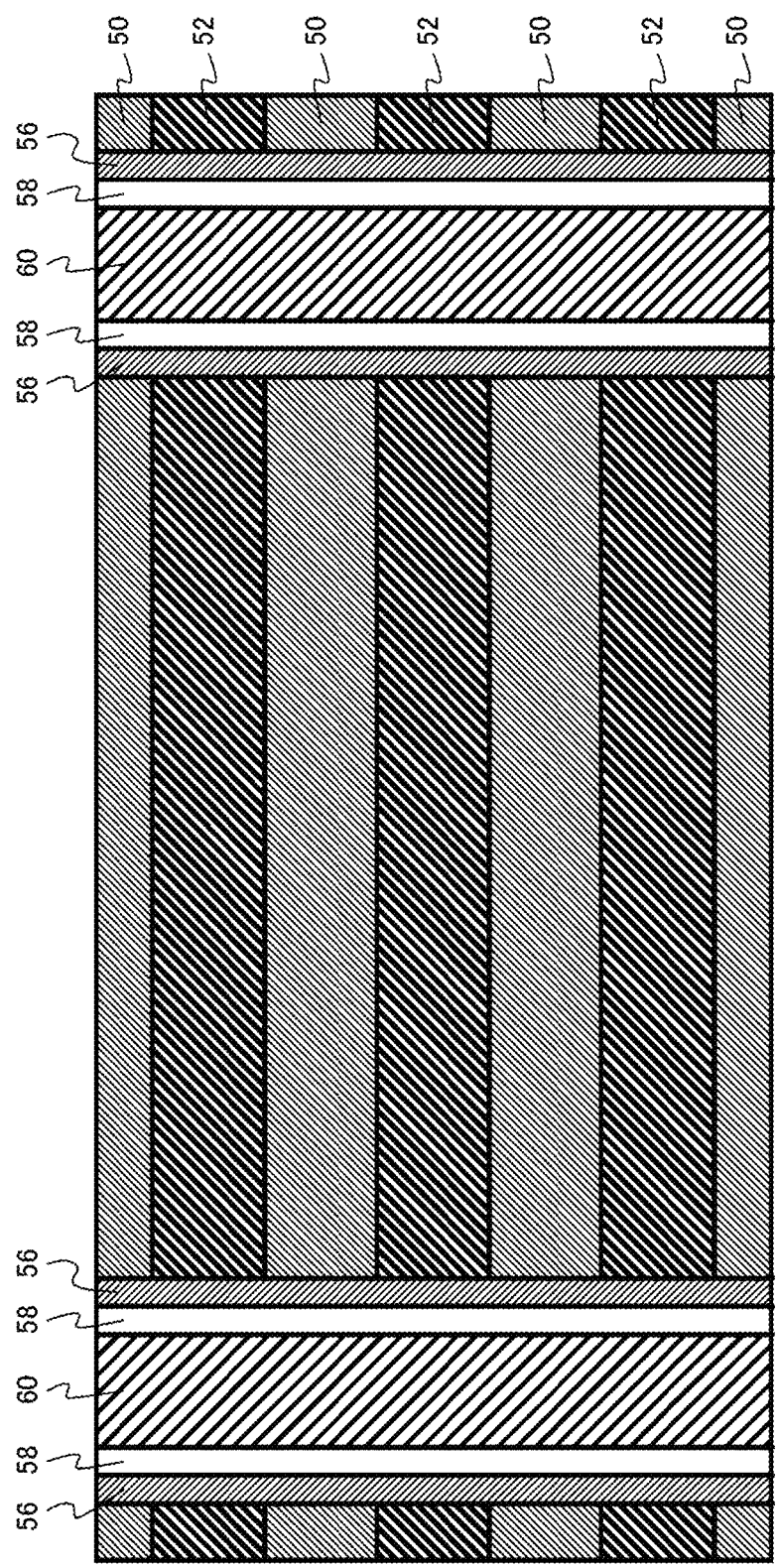

Next, a charge storage film 56, a polycrystalline silicon film 58, and a silicon oxide film 60 are formed inside the memory hole 54 (FIG. 6). The charge storage film 56 is, for example, a layered film of a silicon oxide film, a silicon nitride film, and a silicon oxide film. The charge storage film 56, the polycrystalline silicon film 58, and the silicon oxide film 60 are formed by a CVD method or the like.

The charge storage film 56 is formed into the first charge storage layer 26a and the second charge storage layer 26b. The polycrystalline silicon film 58 is formed into the first semiconductor layer 24a and the second semiconductor layer 24b. The silicon oxide film 60 is formed into the first core insulation layer 28a and the second core insulation layer 28b.

Next, an opening 62 is formed in the silicon oxide films 50 and the silicon nitride films 52 (FIG. 7). The opening 62 is formed by a lithography method, an RIE method, and the like.

Next, the silicon nitride films 52 are selectively removed by wet etching using the opening 62 as an etching groove (FIG. 8). In the wet etching, a phosphoric acid solution or the like is used to selectively etch the silicon nitride films 52 with respect to the silicon oxide films 50 and the charge storage film 56.

Next, aluminum oxide films 64 are formed in regions where the silicon nitride films 52 were removed (FIG. 9). The aluminum oxide films 64 are formed by a CVD method or the like. The aluminum oxide films 64 are formed into the first aluminum oxide layer 30a and the second aluminum oxide layer 30b.

Next, tungsten films 66 are formed (FIG. 10). The tungsten films 66 are formed by a CVD method or the like.

The tungsten films 66 are formed into the first gate electrode layer 22a and the second gate electrode layer 22b. A barrier metal film such as a titanium nitride film may be formed before the tungsten films 66 are formed.

Next, the tungsten films 66 on an inner wall of the opening 62 are removed (FIG. 11). The tungsten films 66 are removed by wet etching or the like.

Next, silicon oxide films 68 containing phosphorus (P) are formed on the inner wall of the opening 62 (FIG. 12). The silicon oxides films 68 are formed by a CVD method or the like. The silicon oxide films 68 are formed into the first silicon oxide layer 18a and the second silicon oxide layer 18b. The silicon oxide films 68 containing phosphorus (P) can also be formed by ion implanting phosphorus into a silicon oxide film containing no phosphorus after the silicon oxide film containing no phosphorus was formed by a CVD method.

Figure 13:
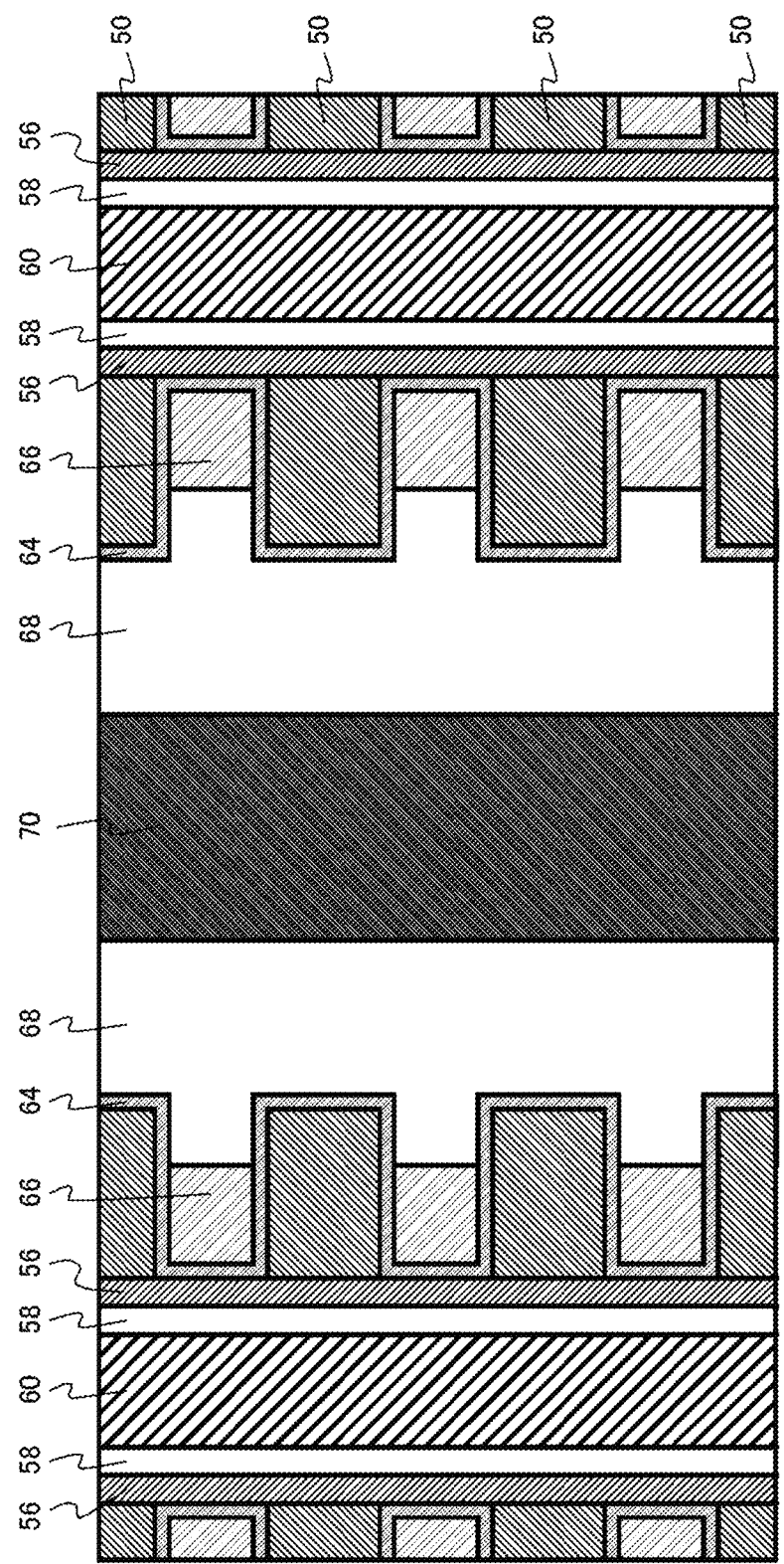

Next, the opening 62 is filled with a tungsten film (FIG. 13). The tungsten film 70 is formed by a CVD method or the like.

The tungsten film 70 is formed into the conductive layer 16. A barrier metal film such as a titanium nitride film may be formed before the tungsten film 70 is formed.

The memory cell array 100 of the semiconductor storage device according to the first embodiment can be manufactured according to the manufacturing method described above.

Next, functions and effects of the semiconductor storage device according to the first embodiment will be described.

In a three-dimensional NAND flash memory, a charge retention property of a memory cell close to an end portion of a stacked body that constitutes a memory cell array may deteriorate significantly. Due to the deterioration of the charge retention property, a data retention failure may occur in the memory cell close to an end portion of a stacked body. The deterioration of the charge retention property of the memory cell close to an end portion of a stacked body is significant particularly when a conductive layer was provided in a region between two stacked bodies.

According to a study result of an inventor, it was found that the deterioration of the charge retention property of the memory cell close to an end portion of a stacked body is prevented by providing a silicon oxide layer containing, as an impurity, at least one element selected from a group including phosphorus (P), boron (B), carbon (C), and fluorine (F) between the end portion of the stacked body and the conductive layer.

In the memory cell array 100 of the semiconductor storage device according to the first embodiment, the first silicon oxide layer 18a containing, as an impurity, at least one element selected from a group including phosphorus (P), boron (B), carbon (C), and fluorine (F) is provided between the first stacked body 12a and the conductive layer 16. The first silicon oxide layer 18a is provided between the first gate electrode layer 22a and the conductive layer 16.

The second silicon oxide layer 18b containing, as an impurity, at least one element selected from a group including phosphorus (P), boron (B), carbon (C), and fluorine (F) is provided between the second stacked body 12b and the conductive layer 16. The second silicon oxide layer 18b is provided between the second gate electrode layer 22b and the conductive layer 16.

As a result, deterioration of the charge retention property of the memory cell close to an end portion of a stacked body is prevented and occurrence of a data retention failure is prevented in the semiconductor storage device according to the first embodiment. Therefore, a semiconductor storage device capable of improving a charge retention property can be implemented according to the first embodiment.

Movable ions are considered as a factor that causes significant deterioration of a charge retention property of the memory cell close to an end portion of a stacked body. Since movable ions such as sodium (Na) and potassium (K) in a memory cell array are trapped in a charge storage layer of the memory cell, a charge retention property of the memory cell may deteriorate. Movable ions enter a memory cell array related to a formation process of a conductive layer, a structure of a conductive layer, or the like, and a charge retention property of a memory cell may deteriorate.

It is known that silicon oxide containing phosphorus (P), for example, has an ability of gettering sodium (Na) or potassium (K). Movable ions can be fixed by the first silicon oxide layer 18a and the second silicon oxide layer 18b, and deterioration of a charge retention property of a memory cell can be prevented.

In terms of preventing the deterioration of a charge retention property of a memory cell, concentrations of the impurity contained in the first silicon oxide layer 18a and the second silicon oxide layer 18b are each preferably $1 \times 10^{17}$ atoms/cm$^3$ or more, and even more preferably $1 \times 10^{18}$ atoms/cm$^3$ or more.

In terms of preventing a leakage current between the first gate electrode layer 22a and the conductive layer 16 and between the second gate electrode layer 22b and the conductive layer 16, concentrations of the impurity contained in the first silicon oxide layer 18a and the second silicon oxide layer 18b are respectively preferably $1\times10^{21}$ atoms/cm³ or less.

As described above, a semiconductor storage device capable of improving a charge retention property can be provided according to the first embodiment.

Second Embodiment

A semiconductor storage device according to a second embodiment is different from the semiconductor storage device according to the first embodiment in that a first silicon oxide layer includes a first region and a second region provided in at least between the first region and a first gate electrode layer or between the first region and a conductive layer, and a concentration of at least one element in the first region is higher than a concentration of at least one element in the second region. Other aspects of the second embodiment are the same or substantially similar to the first embodiment.

The semiconductor storage device according to the second embodiment is a three-dimensional NAND flash memory. A memory cell of the semiconductor storage device according to the second embodiment is a so-called MONOS memory cell.

Figure 14:
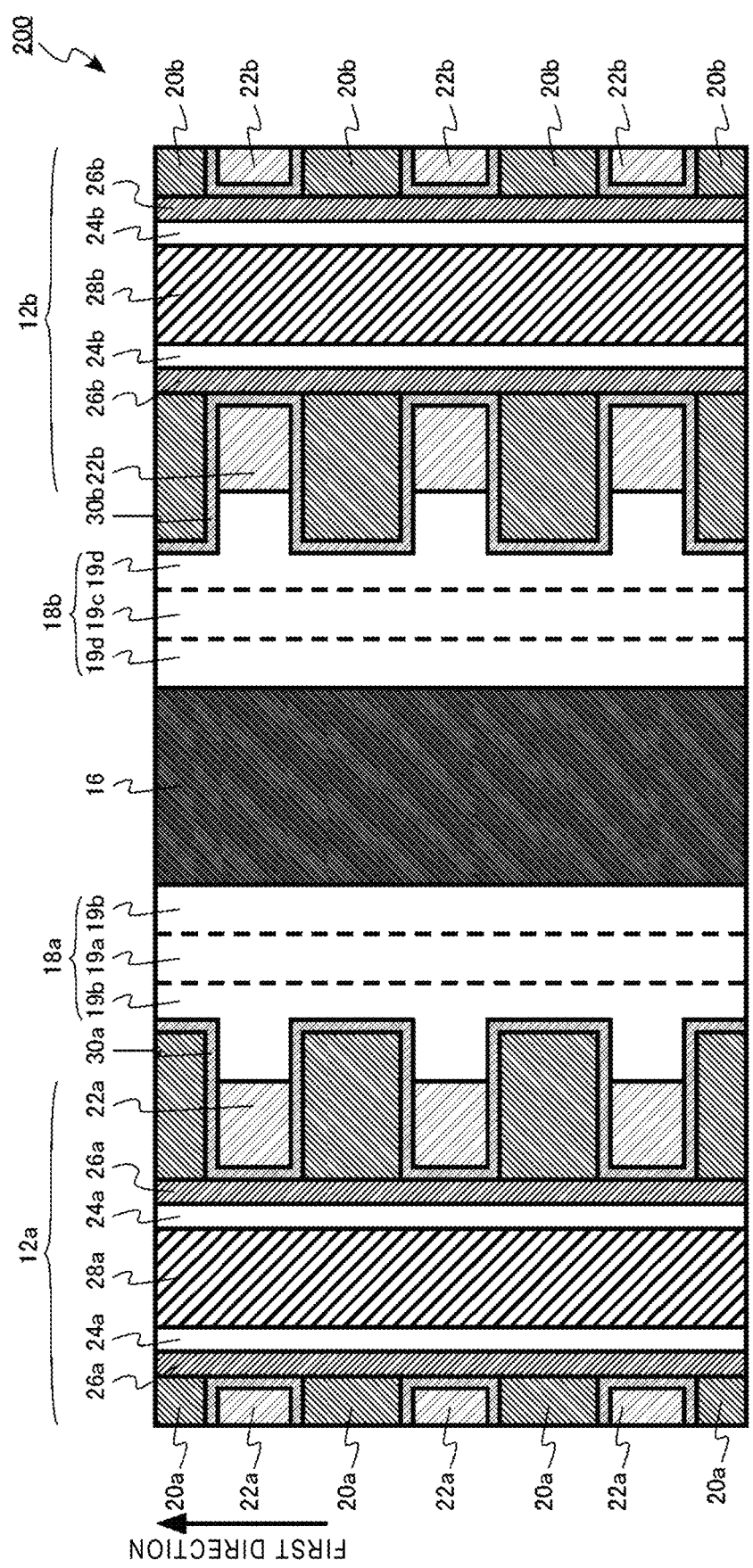
FIG. 14 illustrates an enlarged schematic cross-sectional view of a part of a memory cell array of a semiconductor storage device according to a second embodiment.

FIG. 14 illustrates an enlarged schematic cross-sectional view of a part of a memory cell array of the semiconductor storage device according to the second embodiment.

A memory cell array 200 includes the first stacked body 12a, the second stacked body 12b, the conductive layer 16, the first silicon oxide layer 18a, the second silicon oxide layer 18b, a plurality of first interlayer insulation layers 20a, a plurality of second interlayer insulation layers 20b, a plurality of first gate electrode layers 22a, a plurality of second gate electrode layers 22b, the first semiconductor layer 24a, the second semiconductor layer 24b, the first charge storage layer 26a, the second charge storage layer 26b, the first core insulation layer 28a, the second core insulation layer 28b, the first aluminum oxide layer 30a, and the second aluminum oxide layer 30b.

The first interlayer insulation layer 20a is an example of a first insulation layer. The second interlayer insulation layer 20b is an example of a second insulation layer. The first aluminum oxide layer 30a is an example of an aluminum oxide layer.

The first silicon oxide layer 18a includes a first high impurity concentration region 19a and first low impurity concentration regions 19b. The first high impurity concentration region 19a is an example of a first region. The first low impurity concentration region 19b is an example of a second region and/or a third region.

The first low impurity concentration region 19b is provided between the first high impurity concentration region 19a and the first gate electrode layer 22a. The first low impurity concentration region 19b is provided between the first high impurity concentration region 19a and the conductive layer 16. The first high impurity concentration region 19a is interposed between two first low impurity concentration regions 19b.

The first high impurity concentration region 19a contains, as an impurity, at least one element selected from a group including phosphorus (P), boron (B), carbon (C), and fluorine (F). A concentration of the impurity contained in the first high impurity concentration region 19a is, for example, $1\times10^{17}$ atoms/cm³ to $1\times10^{21}$ atoms/cm³.

A concentration of the impurity contained in the first low impurity concentration region 19b is, for example, less than $1\times10^{17}$ atoms/cm³. The first low impurity concentration region 19b may not contain the impurity.

The second silicon oxide layer 18b includes a second high impurity concentration region 19c and second low impurity concentration regions 19d.

The second low impurity concentration region 19d is provided between the second high impurity concentration region 19c and the second gate electrode layer 22b. The second low impurity concentration region 19d is provided between the second high impurity concentration region 19c and the conductive layer 16. The second high impurity concentration region 19c is interposed between two second low impurity concentration regions 19d.

The second high impurity concentration region 19c contains, as an impurity, at least one element selected from a group including phosphorus (P), boron (B), carbon (C), and fluorine (F). A concentration of the impurity contained in the second high impurity concentration region 19c is, for example, $1\times10^{17}$ atoms/cm³ to $1\times10^{21}$ atoms/cm³.

A concentration of the impurity contained in the second low impurity concentration region 19d is, for example, less than $1\times10^{17}$ atoms/cm³. The second low impurity concentration region 19d may not contain the impurity.

According to the semiconductor storage device in the second embodiment, it is possible to optimally prevent deterioration of a charge retention property of a memory cell and a leakage current between the first gate electrode layer 22a and the conductive layer 16 and between the second gate electrode layer 22b and the conductive layer 16.

The first low impurity concentration region 19b may be provided only either between the first high impurity concentration region 19a and the first gate electrode layer 22a or between the first high impurity concentration region 19a and the conductive layer 16.

Similarly, the second low impurity concentration region 19d may be provided only either between the second high impurity concentration region 19c and the second gate electrode layer 22b or between the second high impurity concentration region 19c and the conductive layer 16.

As described above, a semiconductor storage device capable of improving a charge retention property can be provided according to the second embodiment. Further, it is possible to optimally prevent deterioration of a charge retention property of a memory cell and a leakage current between a gate electrode layer and a conductive layer.

Third Embodiment

A semiconductor storage device according to a third embodiment is different from the semiconductor storage device according to the first embodiment in that the semiconductor storage device according to the third embodiment further includes a third insulation layer provided between a first silicon oxide layer and a first gate electrode layer, and that the third insulation layer contains aluminum oxide or aluminum nitride. Other aspects of the third embodiment are the same or substantially similar to the first embodiment.

The semiconductor storage device according to the third embodiment is a three-dimensional NAND flash memory. A memory cell of the semiconductor storage device according to the third embodiment is a so-called MONOS memory cell.

Figure 15:
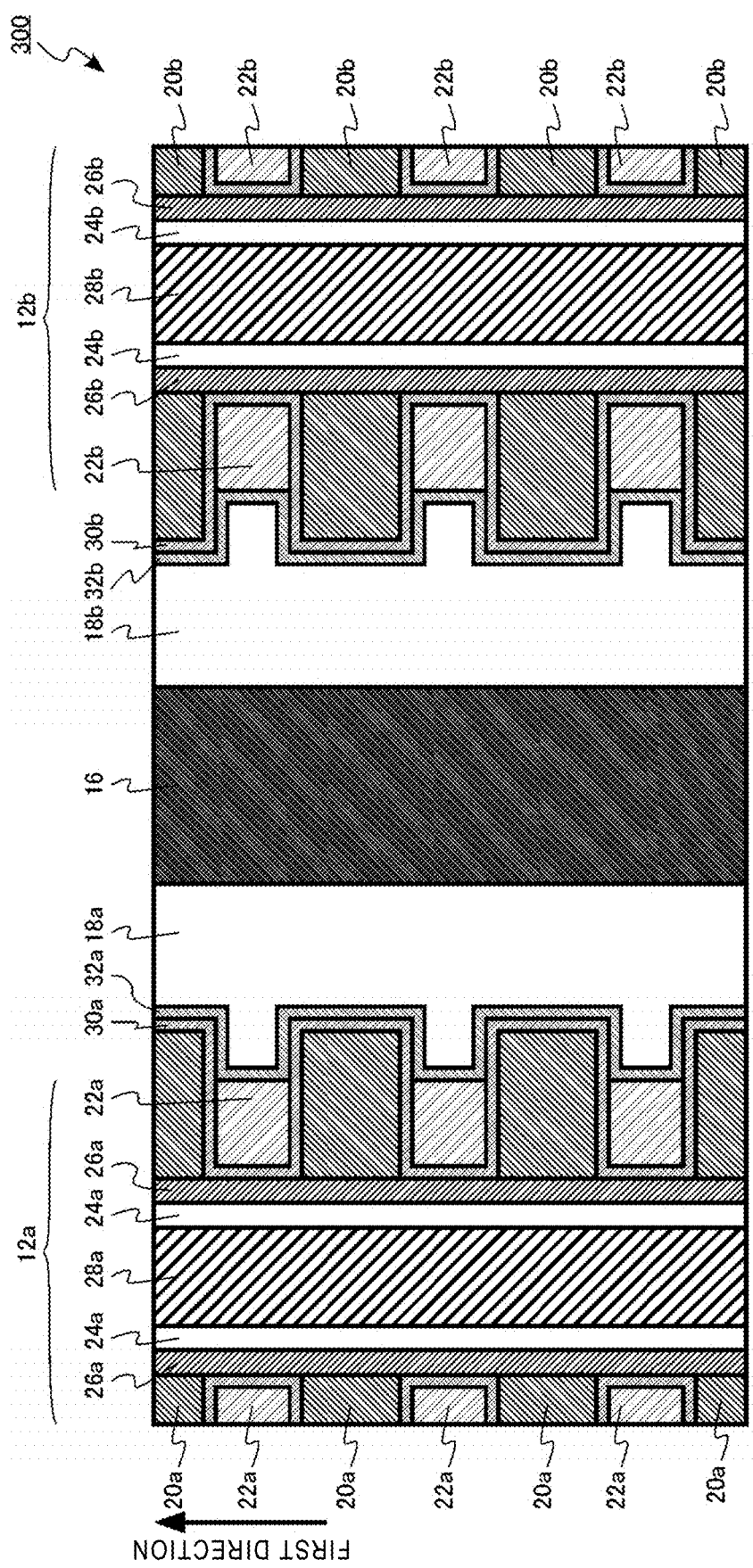
FIG. 15 illustrates an enlarged schematic cross-sectional view of a part of a memory cell array of a semiconductor storage device according to a third embodiment.

FIG. 15 illustrates an enlarged schematic cross-sectional view of a part of a memory cell array of the semiconductor storage device according to the third embodiment.

A memory cell array 300 includes the first stacked body 12a, the second stacked body 12b, the conductive layer 16, the first silicon oxide layer 18a, the second silicon oxide layer 18b, a plurality of first interlayer insulation layers 20a, a plurality of second interlayer insulation layers 20b, a plurality of first gate electrode layers 22a, a plurality of second gate electrode layers 22b, the first semiconductor layer 24a, the second semiconductor layer 24b, the first charge storage layer 26a, the second charge storage layer 26b, the first core insulation layer 28a, the second core insulation layer 28b, the first aluminum oxide layer 30a, the second aluminum oxide layer 30b, a third aluminum oxide layer 32a, and a fourth aluminum oxide layer 32b.

The third aluminum oxide layer 32a is an example of a third insulation layer.

The third aluminum oxide layer 32a is provided between the first silicon oxide layer 18a and the first gate electrode layer 22a. The third aluminum oxide layer 32a is provided between the first silicon oxide layer 18a and the first interlayer insulation layer 20a. The third aluminum oxide layer 32a is provided between the first silicon oxide layer 18a and the first aluminum oxide layer 30a. The third aluminum oxide layer 32a contains aluminum oxide.

The fourth aluminum oxide layer 32b is provided between the second silicon oxide layer 18b and the second gate electrode layer 22b. The fourth aluminum oxide layer 32b is provided between the second silicon oxide layer 18b and the second interlayer insulation layer 20b. The fourth aluminum oxide layer 32b is provided between the second silicon oxide layer 18b and the second aluminum oxide layer 30b. The fourth aluminum oxide layer 32b contains aluminum oxide.

Since the semiconductor storage device according to the third embodiment includes the third aluminum oxide layer 32a, a charge retention property can be further improved. Since the semiconductor storage device according to the third embodiment includes the fourth aluminum oxide layer 32b, a charge retention property can be furthermore improved.

A charge retention property can also be improved similarly by applying an insulation layer containing aluminum nitride instead of the third aluminum oxide layer 32a or the fourth aluminum oxide layer 32b.

As described above, a semiconductor storage device capable of improving a charge retention property can be provided according to the third embodiment. A semiconductor storage device capable of further improving the charge retention property can be provided.

Fourth Embodiment

A semiconductor storage device according to a fourth embodiment is different from the semiconductor storage device according to the first embodiment in that the semiconductor storage device according to the fourth embodiment further includes a fourth insulation layer provided between a first silicon oxide layer and a conductive layer, and that the fourth insulation layer contains aluminum oxide or aluminum nitride. Other aspects of the fourth embodiment are the same or substantially similar to the first embodiment.

The semiconductor storage device according to the fourth embodiment is a three-dimensional NAND flash memory. A memory cell of the semiconductor storage device according to the fourth embodiment is a so-called MONOS memory cell.

Figure 16:
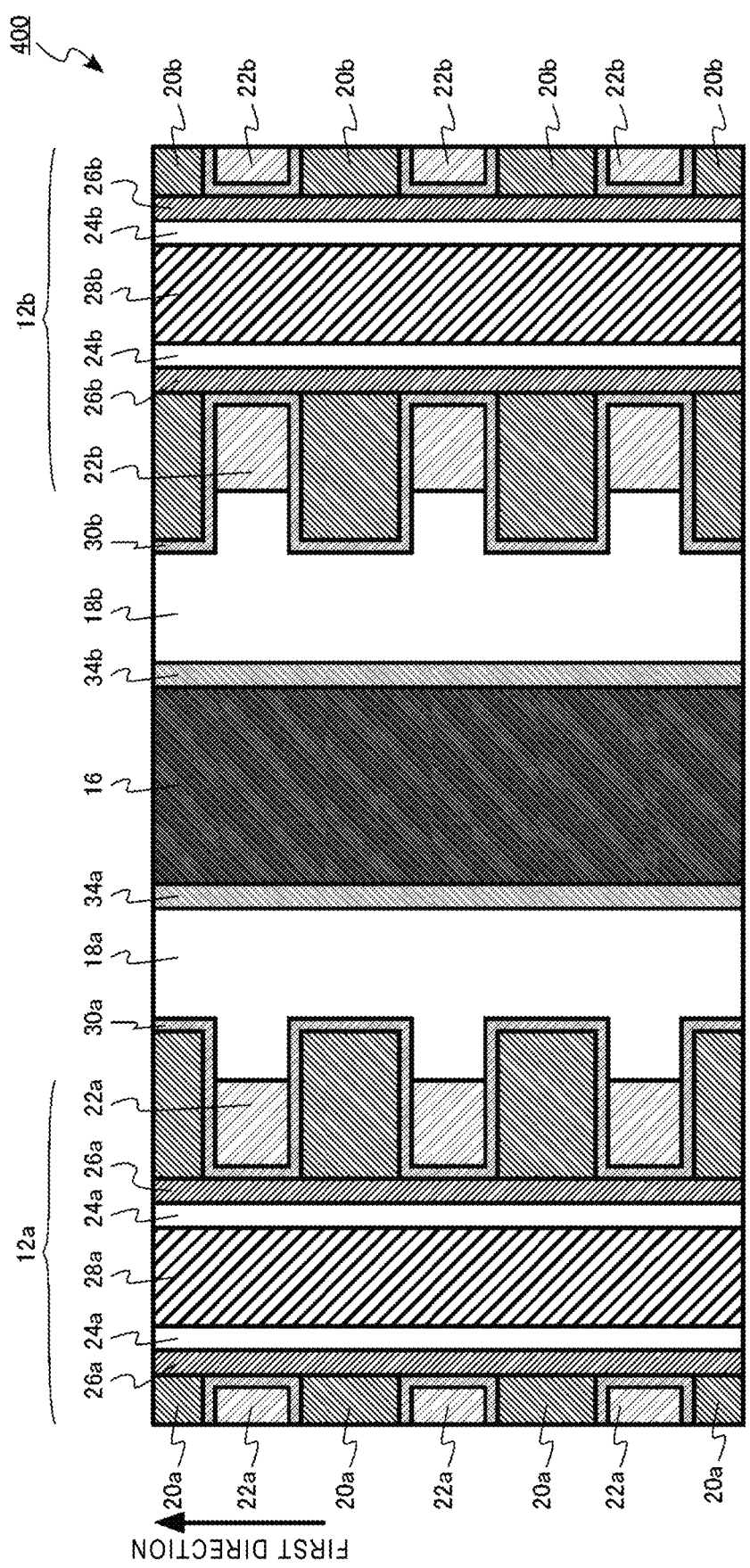
FIG. 16 illustrates an enlarged schematic cross-sectional view of a part of a memory cell array of a semiconductor storage device according to a fourth embodiment.

FIG. 16 illustrates an enlarged schematic cross-sectional view of a part of a memory cell array of the semiconductor storage device according to the fourth embodiment.

A memory cell array 400 includes the first stacked body 12a, the second stacked body 12b, the conductive layer 16, the first silicon oxide layer 18a, the second silicon oxide layer 18b, a plurality of first interlayer insulation layers 20a, a plurality of second interlayer insulation layers 20b, a plurality of first gate electrode layers 22a, a plurality of second gate electrode layers 22b, the first semiconductor layer 24a, the second semiconductor layer 24b, the first charge storage layer 26a, the second charge storage layer 26b, the first core insulation layer 28a, the second core insulation layer 28b, the first aluminum oxide layer 30a, the second aluminum oxide layer 30b, a fifth aluminum oxide layer 34a, and a sixth aluminum oxide layer 34b.

The fifth aluminum oxide layer 34a is an example of a fourth insulation layer.

The fifth aluminum oxide layer 34a is provided between the first silicon oxide layer 18a and the conductive layer 16. The fifth aluminum oxide layer 34a contains aluminum oxide.

The sixth aluminum oxide layer 34b is provided between the second silicon oxide layer 18b and the conductive layer 16. The sixth aluminum oxide layer 34b contains aluminum oxide.

Since the semiconductor storage device according to the fourth embodiment includes the fifth aluminum oxide layer 34a, a charge retention property can be further improved. Since the semiconductor storage device according to the fourth embodiment includes the sixth aluminum oxide layer 34b, a charge retention property can be furthermore improved.

A charge retention property can also be improved similarly by applying an insulation layer containing aluminum nitride instead of the fifth aluminum oxide layer 34a or the sixth aluminum oxide layer 34b.

As described above, a semiconductor storage device capable of improving a charge retention property can be provided according to the fourth embodiment. A semiconductor storage device capable of further improving the charge retention property can be provided.

In the first to fourth embodiments, an interlayer insulation layer between gate electrode layers may be, for example, a cavity or a gap.

Although a memory cell of a MONOS structure was described as an example in the first to fourth embodiments, a memory cell of a floating gate structure using a conductive film may be applied instead of a charge trapping film of a charge storage layer or the like.

Although a structure in which one semiconductor layer is provided in each memory hole was described as an example in the first to fourth embodiments, a structure may be provided in which a plurality of semiconductor layers obtained by dividing the one semiconductor layer into two or more parts is provided in each memory hole. In such a structure, the number of memory cells in a stacked body may be doubled or more.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor storage device, comprising:
a first stacked body including a plurality of first insulation layers and a plurality of first gate electrode layers that are alternately stacked in a first direction;
a first semiconductor layer extending in the first stacked body in the first direction;
a first charge storage layer between the first semiconductor layer and the plurality of first gate electrode layers;
a second stacked body including a plurality of second insulation layers and a plurality of second gate electrode layers that are alternately stacked in the first direction;
a second semiconductor layer extending in the second stacked body in the first direction;
a second charge storage layer between the second semiconductor layer and the plurality of second gate electrode layers;
a conductive layer between the first stacked body and the second stacked body and extending in the first direction and a second direction perpendicular to the first direction; and
a first silicon oxide layer between the conductive layer and the plurality of first gate electrode layers, the first silicon oxide layer containing an impurity that is at least one of phosphorus, boron, carbon, and fluorine, wherein
the first silicon oxide layer includes a first region and a second region between the first region and the plurality of first gate electrode layers, and
a concentration of the impurity in the first region is higher than a concentration of the impurity in the second region.

2. The semiconductor storage device according to claim 1, wherein a concentration of the impurity in the first silicon oxide layer is higher than a concentration of the impurity in the first insulation layer.

3. The semiconductor storage device according to claim 1, wherein a concentration of the impurity in the first silicon oxide layer is in a range equal to or greater than $1\times10^{17}$ atoms/cm$^3$ and equal to or less than $1\times10^{21}$ atoms/cm$^3$.

4. The semiconductor storage device according to claim 1, wherein
a concentration of the impurity in the first region is in a range equal to or greater than $1\times10^{17}$ atoms/cm$^3$ and equal to or less than $1\times10^{21}$ atoms/cm$^3$, and
a concentration of the impurity in the second region is in a range less than $1\times10^{17}$ atoms/cm$^3$.

5. The semiconductor storage device according to claim 1, wherein
the first silicon oxide layer also includes a third region between the first region and the conductive layer, and
a concentration of the impurity in the first region is higher than a concentration of the impurity in the third region.

6. The semiconductor storage device according to claim 1, wherein the first silicon oxide layer is in contact with the plurality of first gate electrode layers.

7. The semiconductor storage device according to claim 1, wherein the first silicon oxide layer is in contact with the conductive layer.

8. The semiconductor storage device according to claim 1, further comprising:
an aluminum oxide layer between the first charge storage layer and the plurality of first gate electrode layers and between the first silicon oxide layer and the plurality of first insulation layers.

9. The semiconductor storage device according to claim 1, further comprising:
a third insulation layer between the first silicon oxide layer and the plurality of first gate electrode layers, wherein
the third insulation layer comprises aluminum oxide or aluminum nitride.

10. The semiconductor storage device according to claim 1, further comprising:
a fourth insulation layer between the first silicon oxide layer and the conductive layer, wherein
the fourth insulation layer comprises aluminum oxide or aluminum nitride.

11. The semiconductor storage device according to claim 1, further comprising:
a second silicon oxide layer between the conductive layer and the plurality of second gate electrode layers, the second silicon oxide layer containing the impurity.

12. The semiconductor storage device according to claim 11, wherein a concentration of the impurity in the first silicon oxide layer is substantially the same as a concentration of the impurity in the second insulation layer.

13. The semiconductor storage device according to claim 1, wherein
each of the plurality of first gate electrode layers comprises tungsten, and
each of the plurality of second gate electrode layers comprises tungsten.

14. The semiconductor storage device according to claim 13, wherein the conductive layer comprises tungsten.

15. The semiconductor storage device according to claim 1, wherein the conductive layer comprises tungsten.

16. The semiconductor storage device according to claim 1, further comprising:
a semiconductor substrate, wherein
the first stacked body and the second stacked body are on the semiconductor substrate, and
the conductive layer is in contact with the semiconductor substrate.

17. The semiconductor storage device according to claim 1, wherein in a cross section along the first direction, the first silicon oxide layer includes a plurality of protrusions protruding towards the plurality of first gate electrode layers, respectively, in a second direction perpendicular to the first direction.

18. A semiconductor storage device, comprising:
a first stacked body including a plurality of first insulation layers and a plurality of first gate electrode layers that are alternately stacked in a first direction;
a first semiconductor layer extending in the first stacked body in the first direction;
a first charge storage layer between the first semiconductor layer and the plurality of first gate electrode layers;
a second stacked body including a plurality of second insulation layers and a plurality of second gate electrode layers that are alternately stacked in the first direction;
a second semiconductor layer extending in the second stacked body in the first direction;
a second charge storage layer between the second semiconductor layer and the plurality of second gate electrode layers;
a conductive layer between the first stacked body and the second stacked body and extending in the first direction and a second direction perpendicular to the first direction; and a first silicon oxide layer between the conductive layer and the plurality of first gate electrode layers, the first silicon oxide layer containing an impurity that is at least one of phosphorus, boron, carbon, and fluorine, wherein the first silicon oxide layer includes a first region and a second region provided between the first region and the conductive layer, and a concentration of the impurity in the first region is higher than a concentration of the impurity in the second region.

19. The semiconductor storage device according to claim 18, wherein a concentration of the impurity in the first region is in a range equal to or greater than $1\times10^{17}$ atoms/cm$^3$ and equal to or less than $1\times10^{21}$ atoms/cm$^3$, and a concentration of the impurity in the second region is in a range less than $1\times10^{17}$ atoms/cm$^3$.

20. The semiconductor storage device according to claim 18, wherein a concentration of the impurity in the first silicon oxide layer is higher than a concentration of the impurity in the first insulation layer.

\* \* \* \* \*